United States Patent
Prikhodko et al.

(10) Patent No.: US 12,106,032 B1
(45) Date of Patent: Oct. 1, 2024

(54) PORT GENERATION BASED ON LAYOUT CONNECTIVITY INFORMATION

(71) Applicant: Cadence Design Systems, Inc., San Jose, CA (US)

(72) Inventors: Mikhail Prikhodko, San Jose, CA (US); Johannes Grad, Bellevue, WA (US); Shritam Mohanty, Irvine, CA (US); Patrick Peiqi Ho, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 494 days.

(21) Appl. No.: 17/493,557

(22) Filed: Oct. 4, 2021

(51) Int. Cl.
*G06F 30/398* (2020.01)
*G06F 30/394* (2020.01)
*G06F 30/392* (2020.01)

(52) U.S. Cl.
CPC .......... *G06F 30/398* (2020.01); *G06F 30/394* (2020.01); *G06F 30/392* (2020.01)

(58) Field of Classification Search
CPC ..... G06F 30/398; G06F 30/394; G06F 30/392
See application file for complete search history.

(56) References Cited

U.S. PATENT DOCUMENTS

| | | | | |
|---|---|---|---|---|
| 6,378,115 B1* | 4/2002 | Sakurai | ................... | G06F 30/39 716/124 |
| 8,656,329 B1* | 2/2014 | Kukal | ................... | G06F 30/367 716/108 |
| 10,068,039 B1* | 9/2018 | Vennam | ................... | G06F 30/23 |
| 11,501,044 B1* | 11/2022 | Farrahi | ................... | G06F 30/31 |
| 2006/0059447 A1* | 3/2006 | Ariyama | ................... | G06F 30/39 716/126 |
| 2006/0190900 A1* | 8/2006 | Chan | ................... | G06F 30/3312 716/113 |
| 2006/0271891 A1* | 11/2006 | Rautio | ................... | G06F 30/398 716/111 |
| 2010/0217576 A1* | 8/2010 | Bharath | ................... | G06F 30/23 703/14 |
| 2011/0161905 A1* | 6/2011 | Zhao | ................... | G06F 30/398 716/115 |
| 2012/0150523 A1* | 6/2012 | Choi | ................... | G06F 30/23 703/14 |
| 2012/0221990 A1* | 8/2012 | Dai | ................... | G06F 30/30 716/112 |
| 2013/0185690 A1* | 7/2013 | Pekarek | ................... | G06F 30/20 716/119 |
| 2022/0164513 A1* | 5/2022 | Chao | ................... | G06F 30/392 |
| 2023/0108733 A1* | 4/2023 | He | ................... | H04L 67/52 709/223 |
| 2023/0267258 A1* | 8/2023 | Kawasaki | ................... | G06F 30/39 716/100 |

\* cited by examiner

*Primary Examiner* — Nha T Nguyen
(74) *Attorney, Agent, or Firm* — Schwegman Lundberg & Woessner, P.A.

(57) ABSTRACT

Various embodiments provide for port generation for a circuit design based on layout connectivity information, which can be used as part of an automatic or a semi-automatic process of an electronic design automation (EDA) system. For instance, various embodiments access connectivity information for one or more networks of a circuit design, and use the connectivity information to identify pins of signal networks as positive connections for ports, and geometric shapes on references networks as candidates for negative connections for ports.

20 Claims, 12 Drawing Sheets

PORT GENERATION BASED ON LAYOUT CONNECTIVITY INFORMATION

TECHNICAL FIELD

Embodiments described herein relate to circuit design and, more particularly, to systems, methods, devices, and instructions for port generation for a circuit design based on layout connectivity information, which can be used as part of an electronic design automation (EDA) system.

BACKGROUND

Modern electronic design is typically performed with the use of an electronic design automation (EDA) system. EDA systems can use an electromagnetic (EM) computer simulation (or an EM field solver) in designing high-frequency circuits. In particular, an EM computer simulation can be used in extracting parasitic circuit models from a circuit design (such as a scattering parameter or s-parameter model), which can be used in testing/verifying timing, signal integrity, substrate coupling, power grid analysis and the like with respect to the circuit design. A FEM (finite element method) electromagnetic solver represents one type of EM computer simulation that can handle multiple ports of a circuit design and that can be used on three-dimensional (3D) structures of a circuit design.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
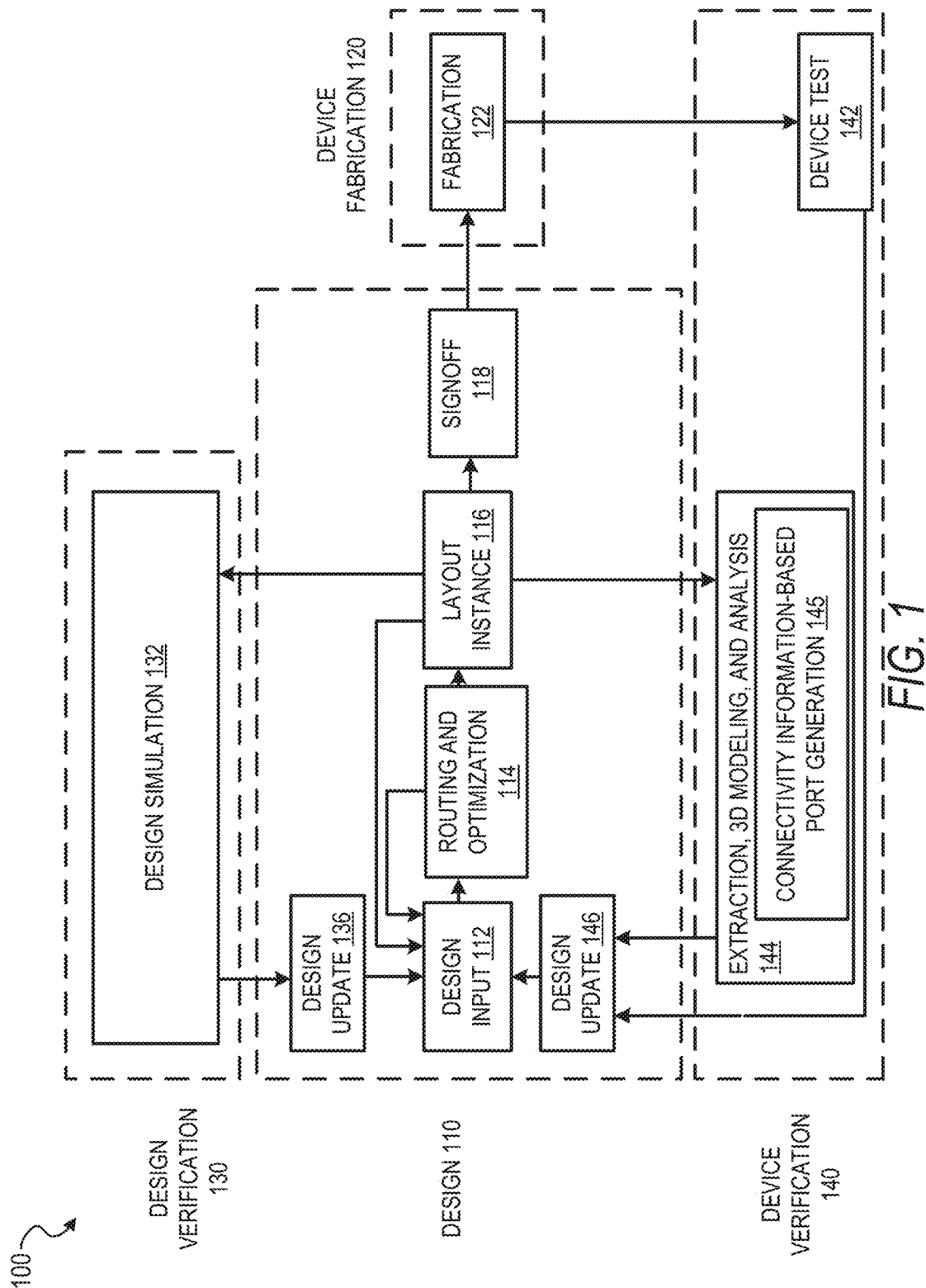
FIG. 1 is a diagram illustrating an example design process flow for port generation for a circuit design based on layout connectivity information, according to some embodiments.

To perform an EM computer simulation of a circuit design, conventional FEM electromagnetic solvers rely on a complicated port setup, where each port has two connections (e.g., positive connection and negative connection) and a width. The port setup process generally comprises defining (e.g., identifying) a positive port connection (or positive connection) and a negative port connection (or negative connection) for each port that the conventional FEM electromagnetic solvers may use to perform an EM computer simulation of a circuit design. A positive connection of a port is usually located on a signal network of the circuit design where energy is injected into the signal network, and a negative connection of a port is usually located on a reference network (such as a ground network) of the circuit design. In the circuit design, a port represents a two-dimensional (2D) geometric shape (e.g., rectangle) in a 3D space connecting together a positive connection and a negative connection. One or more factors (e.g., circuit design constraints) can determine whether a port (e.g., defined during the port setup) is valid. One of those factors include that a geometric shape (e.g., rectangle) representing the port should not intersect any other conductors of the circuit design. Additionally, there is a general preference for the length of a port to be as small as possible, which helps in reducing or mitigating the self-inductance of the port (e.g., where self-inductance of a port can be determined based on a ratio between length and width of the port). Unfortunately, traditional solutions for port setup involve a user (e.g., circuit engineer) manually selecting locations (in a circuit design) for positive and negative connections for ports and selecting widths for ports.

Various embodiments provide for port generation for a circuit design based on layout connectivity information, which can be used as part of automatic or semi-automatic process of an electronic design automation (EDA) system. In particular, various embodiments described herein access connectivity information for one or more networks (or nets) of a circuit design, and use the connectivity information to identify pins (e.g., centers of pins) of signal networks (or nets) as positive connections for ports, and geometric shapes on references nets (e.g., ground nets) as candidates for negative connections for ports. In doing so, some embodiments can provide locations of positive connections and possible locations for negative connections, from which a user can manually select negative connections for different ports. Alternatively, based on identified positive connections and negative connections, some embodiments can automatically select negative connections for different ports such that resulting ports are valid. Additionally, some embodiments can automatically determine a width for different ports. Various embodiments described herein are performed by, or implemented within, a circuit design layout tool, such as one that forms part of an EDA system.

As used herein, a port can comprise at least a positive connection (or a positive connection point) and a negative connection (or a negative connection point), where the positive connection is where energy is injected into to a signal net of a circuit design, the negative connection is disposed on a reference net (e.g., ground) of the circuit design, and the port connection connects the positive connection point to the negative connection point. A port can have a width and can be represented as a two-dimensional (2D) geometric shape (e.g., rectangle in a 3D space) that connects the positive and the negative connection points. Generally, a valid port is one that connects the positive and the negative connection points without intersecting any other conductors of the circuit design. For various embodiments, when generating a port, the length of the port is minimized as much as possible to avoid or reduce self-inductance by the port. Additionally, for some embodiments, when generating a port, the size of the port is reduce, which can reduce coupling to one or more neighboring ports or conductors that cannot be effectively de-embedded easily from FEM simulation results.

As used herein, a circuit design can comprise a layout (e.g., 3D layout, with multiple layers), where the layout comprises at least one signal network and at least one reference network, such as a ground network. A signal network can comprise a pin, such as a top-level pin, a pin between two devices of a circuit design, or a pin formed at a network cut point (e.g., a selection cut point caused by a layout selection within a layout tool). Circuit design data can describe one or more geometric structures of a circuit design, and connectivity information (provided by the circuit design data) can describe how geometric structures of the circuit design are connected. As used herein, a port generated by an embodiment can cross multiple layers of a circuit design. As used herein, a positive connection can be disposed on a center of a pin of a signal network of a circuit design. As used herein, a negative connection of a port can comprise a geometric shape disposed on a network (e.g., reference network, such as a ground network) of a circuit design.

As used herein, connectivity information describes a connectivity of one or more networks of a circuit design. In general, integrated circuit (IC) structures of a circuit design can be stored in a database (e.g., Open Access database). When a named pin layer is placed on a metal layer of the circuit design, then based on connectivity rules (e.g., defined in a technical file or techfile), a whole routing layer is assigned or propagated a network name (net name) that is the same as the named pin. Connectivity information can store this assignment and propagation of the network name. For example, with respect to a metal layer-1 (M1) and a metal layer-2 (M2) of a circuit design, an example techfile (that provides connectivity rules) can describe that a M1/drawing layer-purpose pair (LPP) is electrically coupled to M1/pin LPP if shapes on these LPPs overlap and that the M1/drawing is electrically coupled to M2/drawing through a V12/drawing. For some embodiments described herein, the origin point of a positive (e.g., +ve) connection point for a port connection is the center of the pin layer, and a negative (e.g., −ve) connection point can be selected based on the candidate group of negative connection points (e.g., with selection criteria for creating valid port with minimum self-inductance and mutual inductive, capacitive coupling).

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for port generation for a circuit design based on layout connectivity information, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. Though not shown, the routing and optimization 114 operation can include a clock tree synthesis (CTS) operation, which can generate one or more clock trees that deliver clock signals from clock sources of a circuit design to a plurality of clock tree leaf nodes comprising clock tree pins (e.g., of circuit devices, such as flip-flops) within the circuit design. The routing and optimization 114 operation may also include other operations not shown, such as those relating to floorplanning, placement, post-placement optimization, and post-routing optimization.

While the design process flow 100 shows optimization occurring prior to a layout instance 116, timing analysis, and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

Design inputs are used in the design input 112 operation to generate an initial circuit layout. The design inputs may be further processed during the design input 112 operation via a process such as logic-synthesis to generate a circuit netlist mapped to a target standard library manufacturable by the foundry in fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

As shown, the extraction, 3D modeling, and analysis 144 operation includes an operation 145 for connectivity information-based port generation, which may be performed in accordance with various embodiments described herein. For some embodiments, operation 145 can be performed as part of, or just prior to, an EM simulation process (e.g., using a FEM electromagnetic solver) performed on a circuit design, which can be used (e.g., by an EDA system) to perform a high-frequency circuit design verification process or a signal integrity test process on the circuit design.

Figure 2:
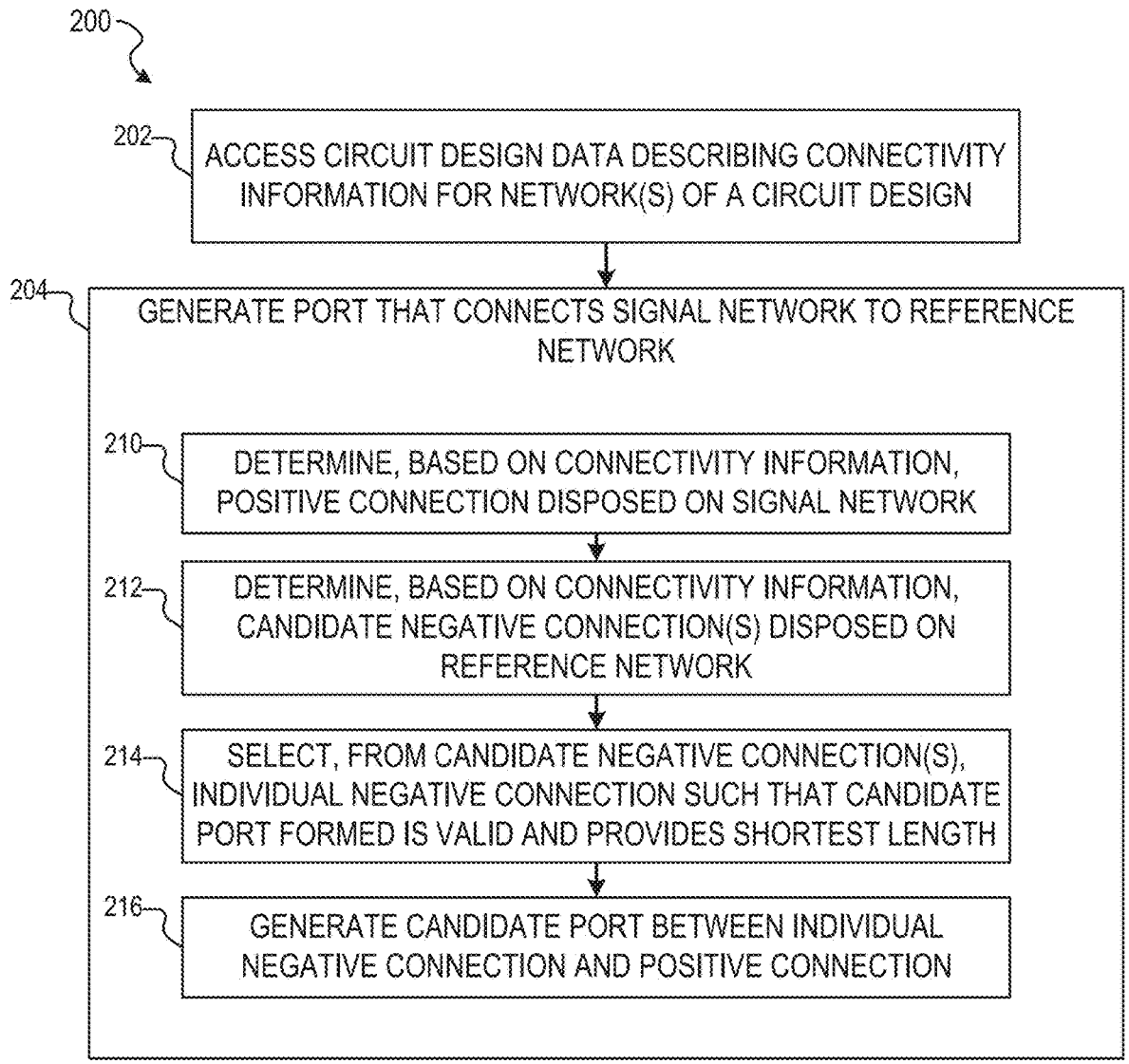
FIGS. 2 through 4 are flowcharts illustrating example methods for connectivity information-based port generation, according to some embodiments.
Figure 3:
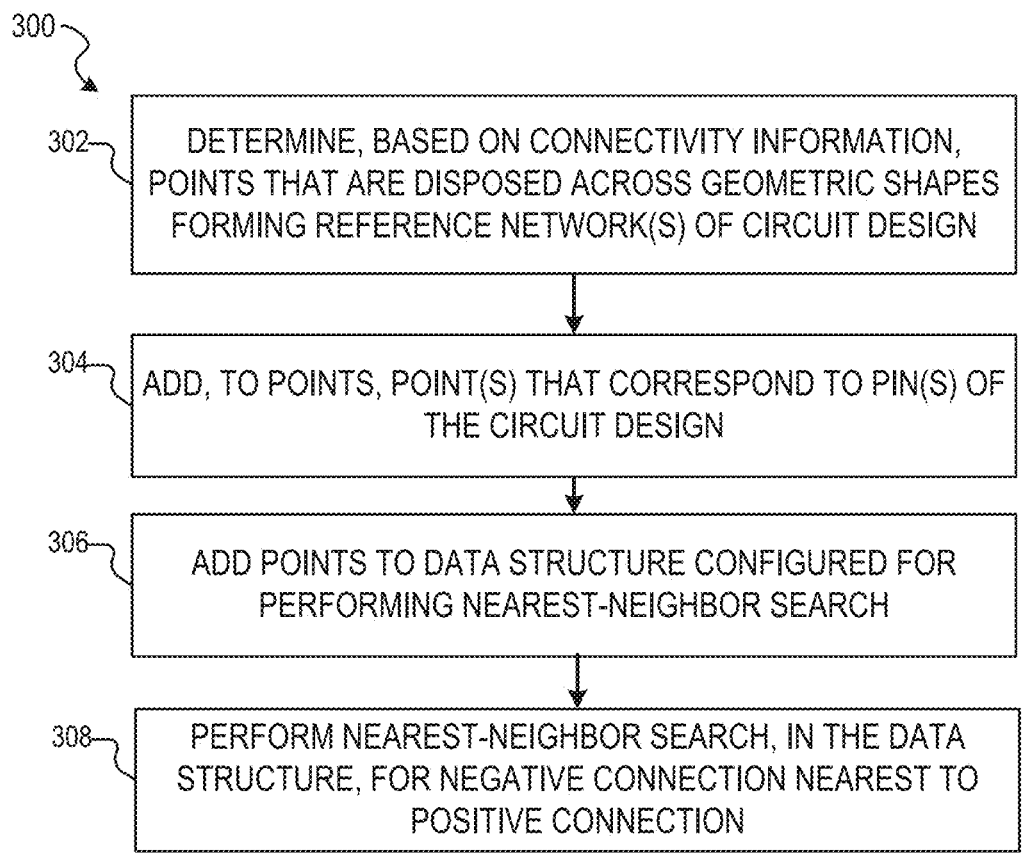
Figure 4:
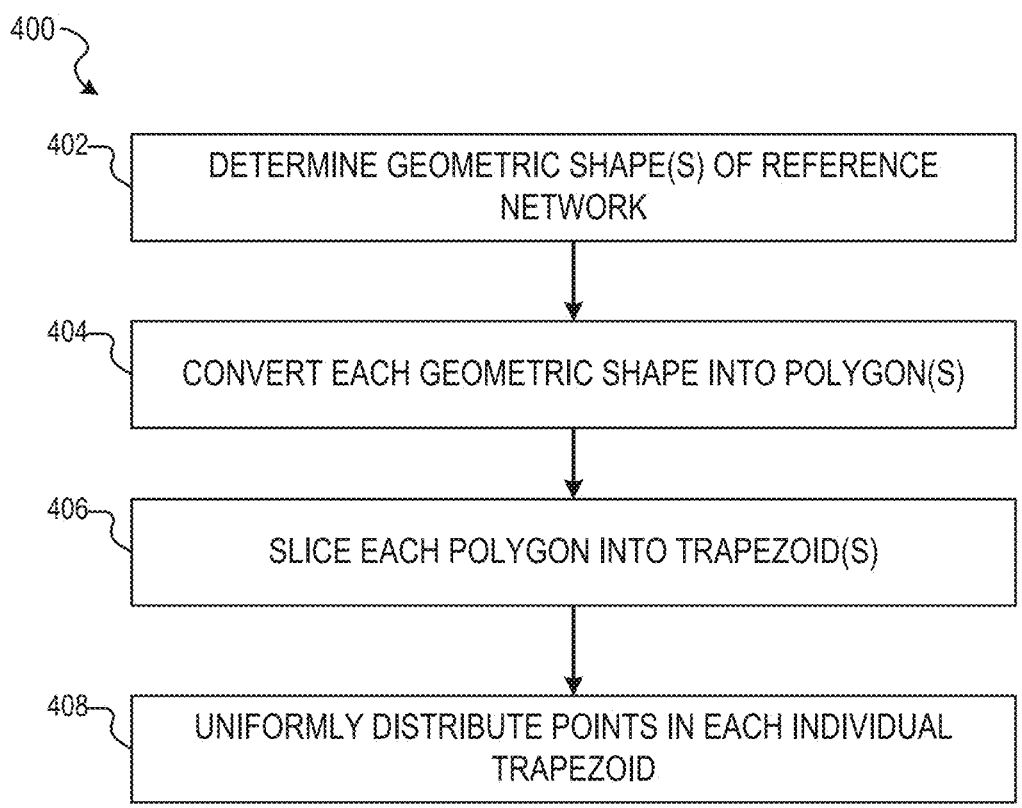

FIGS. 2 through 4 are flowcharts illustrating example methods for connectivity information-based port generation, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for connectivity information-based port generation, according to some embodiments. The method 200 can be performed, for example, as part of an EM simulation process (e.g., using a FEM electromagnetic solver) performed on a circuit design. An operation of the method 200 (or another method described herein) may be performed by a hardware processor (e.g., central processing unit or graphics processing unit) of a computing device (e.g., desktop, server, etc.).

The method 200 as illustrated begins with operation 202 accessing circuit design data that describes connectivity information for one or more networks of a circuit design, where the one or more networks include a signal network and a reference network. For some embodiments, the reference network comprises a ground network of the circuit design. Additionally, the signal network can comprise one or more pins, which can be defined or described by the circuit design data.

The method 200 continues with operation 204 generating an individual port that connects the signal network to the reference network based on the connectivity information (from the circuit design accessed by operation 202). The individual port can represent one of a plurality of ports to be generated (e.g., for the EM simulation process). As shown, during operation 204, operations 210 through 216 are performed for each individual port generated (e.g., from the plurality of ports). Based on the connectivity information, a positive connection disposed on the signal network is determined (e.g., identified) at operation 210. For some embodiments, a center of a positive connection pin of the signal network is selected as the positive connection of the individual port.

Additionally, based on the connectivity information, one or more candidate negative connections disposed on the reference network is determined (e.g., identified) at operation 212. During operation 214, an individual negative connection is selected, from the one or more candidate negative connections, such that a candidate port formed between the individual negative connection and the positive connection is valid and provides a shortest length (e.g., in comparison to any other candidate port that is also valid). Additionally, an individual negative connection can be selected from the set of candidate negative connections based on a resulting length of the candidate port. For instance, the individual negative connection selected can be a negative connection nearest (e.g., nearest neighbor) to the positive condition that results in a candidate port with a minimal length. Depending on the embodiment, a function can be used to determine (e.g., check) whether a port (e.g., a candidate port) is valid or not. For some embodiments, an EM simulation processes (e.g., FEM electromagnetic solver) determines a definition of a valid port. Accordingly, the function used to determine (e.g., check) port validity can be different for different EM simulation processes (e.g., different FEM electromagnetic solvers). Additionally, the function may or may not be part of (e.g., provided by) the applicable EM simulation processes. As described herein, a candidate port is valid if it connects the individual negative connection and the positive connection without intersecting any other conductors of the circuit design.

For some embodiments, operation 214 comprises causing presentation of the set of candidate negative connections on a client device, and receiving, by the client device, a user selection of the individual negative connection. For instance, the presentation is superimposed on a graphical representation of a layout of a circuit design presented (on the client device) through a user interface (e.g., graphical user interface of an EDA system). A user selection of an individual negative connection can be used in place of, or in addition to, automatic selection of the individual negative connection as described herein.

At operation 216, the candidate port is generated as the individual port, where the candidate port connects the individual negative connection and the positive connection. For some embodiments, the candidate port is generated with a select width based on one or more port validity criteria and based on at least one of a minimal port width or a maximum port width, where the minimal port width, the maximum port width, or both can be defined (e.g., identified) by a user (e.g., circuit engineer). For instance, based on the minimal port width and the maximum port width, an embodiment can determine (e.g., identify) the select width such that it is optimal while ensuring that the candidate port remains valid. For example, the select width of the candidate port can be determined such that the select width remains smaller than or equal to the thickness of the wire being used for the candidate port; otherwise the candidate port would be rendered invalid. Additionally, the one or more port validity criteria can ensure, for example: that as the width of a port increases, the port avoid does not start overlap with some unrelated shapes that would render the port invalid, or that port does become larger than the width of metal shapes at the +/− connections. In this way, the one or more port validity criteria can assist in maximizing the width of a port so that the port is still valid with respect to general port validity criteria and within the specified min-max range. The select width can be determined such that the select width does not cause the candidate port to intersect with any other conductors. Additionally, the select width can be determined such that the ratio of the select width and the length of the candidate port reduces reduces/minimizes self-inductance of the candidate port. For some embodiments, the select width is determined by trying one or more width values between the minimal port width and the maximum port width until the select width is determined (e.g., identified). For instance, an embodiment can start with the minimal port width and step up (e.g., at a step value) until the maximum port width is reached. For some embodiments, the select width is determined based on performing a bisection method on the minimal port width and the maximum port width, which can assist in determining an optimized width for the candidate port. For example, where the minimal port width is 1 nm and the maximum port width is 10 nm, the first width tried is 1 nm, the second width tried is 10 nm, the third width tried is 5 nm, the fourth width tried is 7.5 nm, the fifth width tried is 6.25 nm, and so on. An embodiment can determine a default for either min width, max width, or both (e.g., use the 0 min width and infinite max width), where the embodiment can use the min width or max width explicitly specified (e.g., by a user) in place of any defaults determined by the embodiment.

For some embodiments, where operation 214 is unable to automatically select (e.g., identify or find) an individual negative connection (from the one or more candidate negative connections) that results in a candidate port (formed between the individual negative connection and the positive connection) that is valid, a user can be prompted to manually connect the positive connection to one of the candidate negative connections (e.g., by user manually changing the geometry of the circuit design). Operation 214 may be automatically unable to select (e.g., identify or find) an individual negative connection (from the one or more candidate negative connections) because operation 214 is automatically unable to find a place to dispose the negative connection.

A port generated by the method 200 (or another method described herein) can either be a same layer, cross layer or diagonal port. For instance, a same layer port can comprise positive (e.g., +ve) and negative (e.g., −ve) connection points on the same metal layer and z-axis elevation within the circuit design. A cross layer port can comprise positive (e.g., +ve) and negative (e.g., −ve) connection points on metal layers M and M−1 respectively, where the metal layers M, M−1 can be directly on top of each other (e.g., may or may not be consecutive layers) and the positive and the negative connection points share the same x-coordinates of within circuit design. A diagonal port can comprise positive (e.g., +ve) and negative (e.g., −ve) connection points on metal layers M, M−1 layers respectively (e.g., may or may not be consecutive layers) and can have different x/y coordinates within the circuit design. Some embodiments are able to determine a shortest distance for a port length from either using a same layer port, a cross layer port, or a diagonal port, and to determine the best one to choose. In the z-axis, some embodiments traverse a circuit design (e.g., of an IC) stack up information to determine the height of the metal layers and dielectrics, which can be provided as user input.

Referring now to FIG. 3, the flowchart illustrates the example method 300 for generating an individual port that connects a signal network to a reference network, according to some embodiments. In particular, the method 300 illustrates a more specific implementation of operation 204 of the method 200 described above with respect to FIG. 2.

Based on the connectivity information, operation 302 determines a plurality of reference points (hereafter, referred to as "points") that are disposed across geometric shapes forming one or more references networks (in a set of networks) of a circuit design. For some embodiments, operation 302 uniformly (e.g., evenly) disposes one or more points across geometric shapes forming one or more reference networks (in the set of networks). By doing so, operation 302 generates a mesh of points uniformly (e.g., evenly) distributed across all geometric shapes of one or more reference networks of the circuit design. The one or more reference networks can comprise one or more ground networks. Additionally, for some embodiments, operation 302 disposes a point on each pin on a signal network of the circuit design. According to various embodiments, determination of a positive connection disposed on the signal network comprises selecting an individual point (from the plurality of points) on the signal network as the positive connection. Additionally, in various embodiments, determination of a set of candidate negative connections disposed on the reference network comprises selecting a set of points (from the plurality of points) on the reference network as the set of candidate negative connections.

At operation 304, one or more points, associated with (e.g., corresponding to) one or more pins of the circuit design, are added to the plurality of points. For example, the one or more pins can include one or more pins disposed on one or more signal networks of the circuit design. Additionally, the one or more pins can include one or more pins disposed on one or more reference networks of the circuit design. The one or more points being added to the plurality of points can be associated with (e.g., correspond to) any points that should have special treatment, such as pins.

For operation 306, the plurality of points (e.g., candidate negative connections) is added to a data structure that is configured for performing a nearest-neighbor search (e.g., k-nearest neighbor search). For some embodiments, the data structure comprises a data structure that is optimized for 3D k-nearest neighbor search.

At operation 308, a nearest neighbor search (e.g., a nearest-neighbor query) is performed, in the data structure, for a second point nearest to the positive connection, where the second point represents a negative connection that would form a valid port with the positive connection. For some embodiments, the nearest-neighbor search is performed until the valid port with a select width (e.g., one determined based on at least one of a minimal port width) is identified.

Referring now to FIG. 4, the flowchart illustrates the example method 400 for determining a plurality of points that are uniformly disposed across geometric shapes forming a reference network of a circuit design, according to some embodiments. In particular, the method 400 illustrates a more specific implementation of operation 302 of the method 300 described above with respect to FIG. 3.

At operation 402, one or more geometric shapes of a reference network are determined. Thereafter, operation 404 converts the one or more shapes (from operation 402) into one or more polygons. During operation 406, each individual polygon, in the one or more polygons, is sliced into one or more trapezoids. Subsequently, during operation 408, a set of points is uniformly (e.g., evenly) distributed in each individual trapezoid in the one or more trapezoids.

Figure 8:
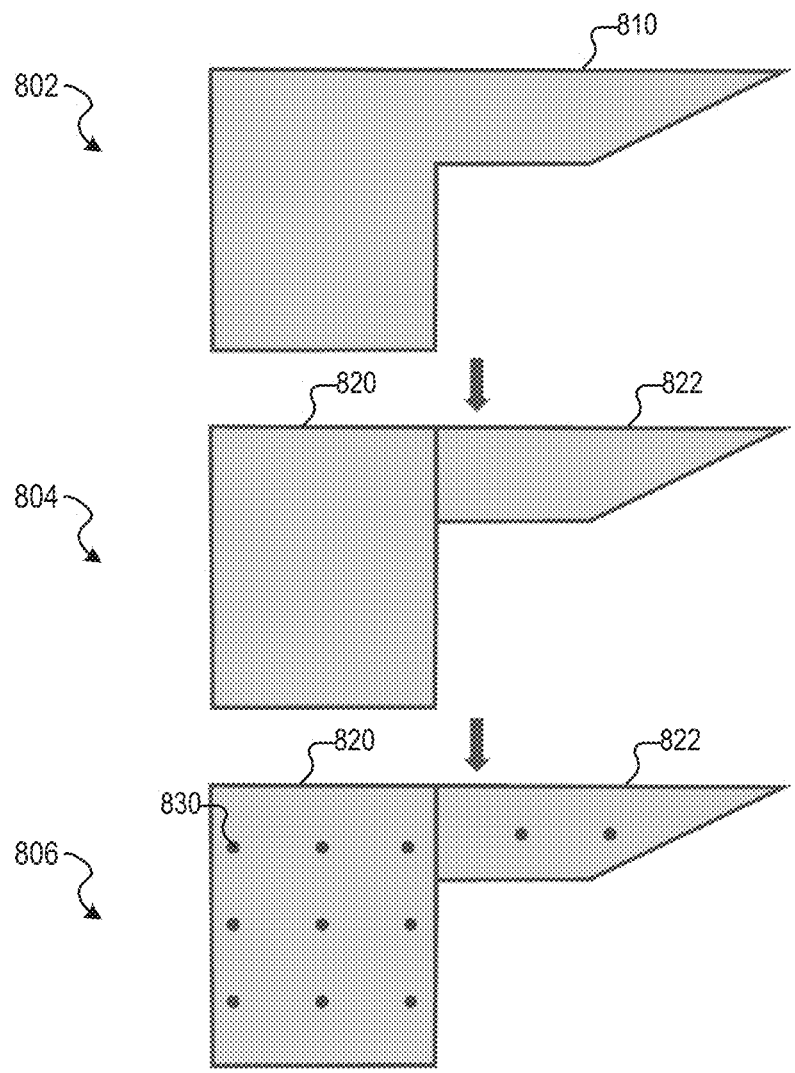
FIGS. 8 through 10 illustrate examples for distributing points within graphic shapes of networks, according to some embodiments.
Figure 9:
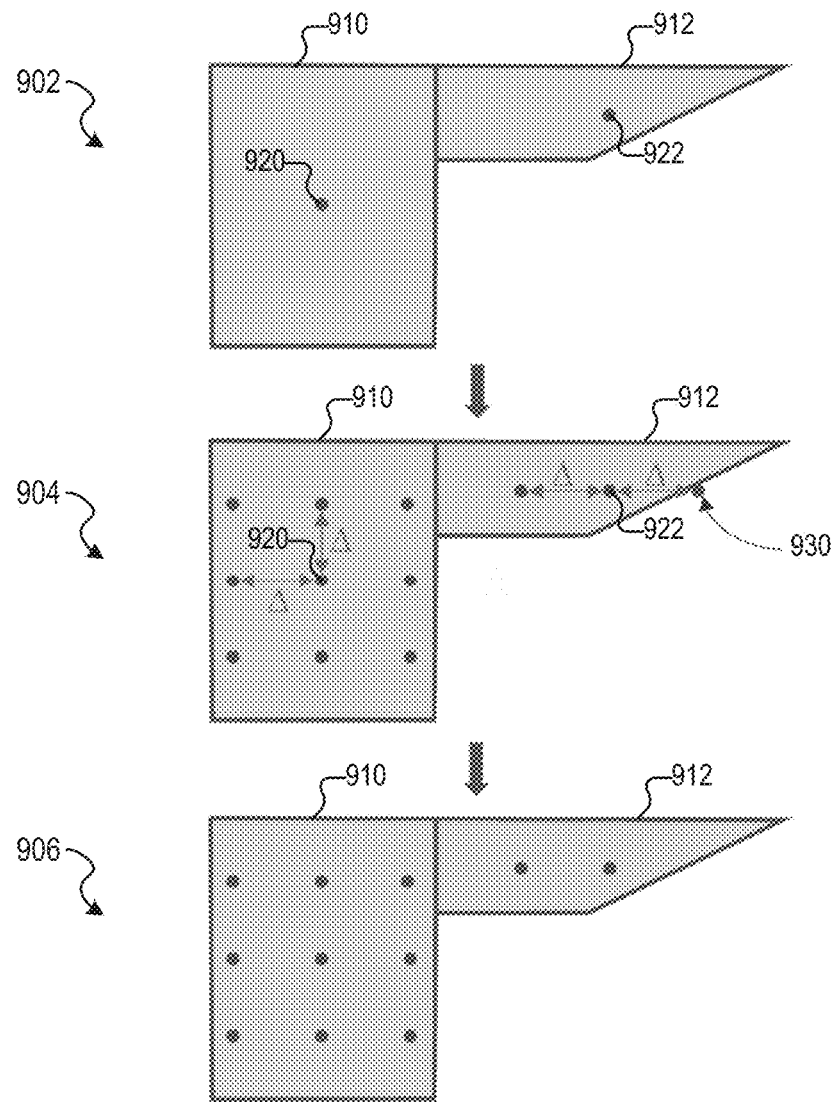

For some embodiments, operation 408 uniformly distributes the set of points in the individual trapezoid starting in the center of the individual trapezoid. An example of this is illustrated by FIG. 8. For some embodiments, the set of points is distributed in an individual trapezoid by identifying a center of the individual trapezoid, and generating an orthogonal point lattice around the center with a given spacing (e.g., user defined spacing), which can result in the uniform distribution of points. An example of this is illustrated by FIG. 9. In response to the individual trapezoid having at least one non-Manhattan edge, some embodiments remove any points from the orthogonal point lattice that are not within the individual trapezoid.

Figure 10:
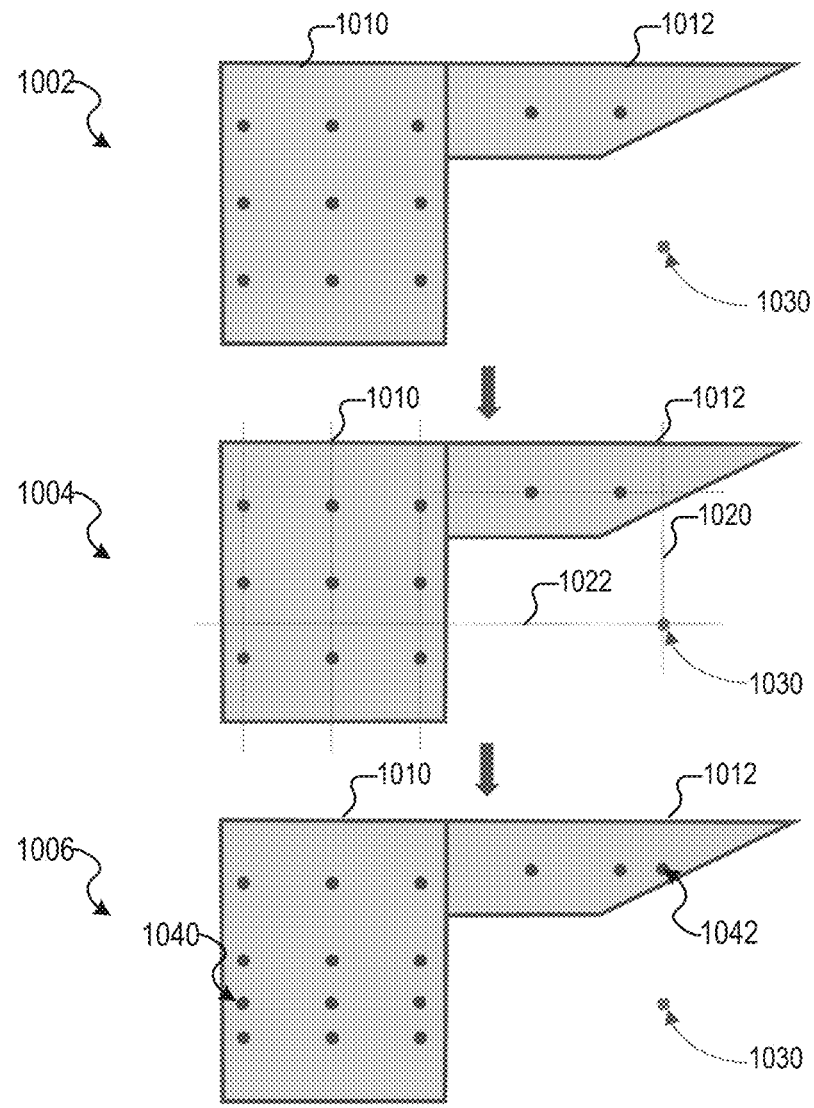

An example of this is also illustrated by FIG. 9. Where points are uniformly distributed in an individual trapezoid by generating an orthogonal point lattice in the individual trapezoid, at least one additional point disposed within the individual trapezoid can be added to the plurality of points, where the at least one additional point either has: a first horizontal coordinate (e.g., x-axis coordinate) corresponding to a location of the individual positive connection and a first vertical coordinate (e.g., y-axis coordinate) corresponding to at least one point in the orthogonal point lattice; or a second horizontal coordinate (e.g., x-axis coordinate) corresponding to the at least one point in the orthogonal point lattice and a second vertical coordinate (e.g., y-axis coordinate) corresponding to the location of the individual positive connection. An example of this is illustrated by FIG. 10.

Figure 5:
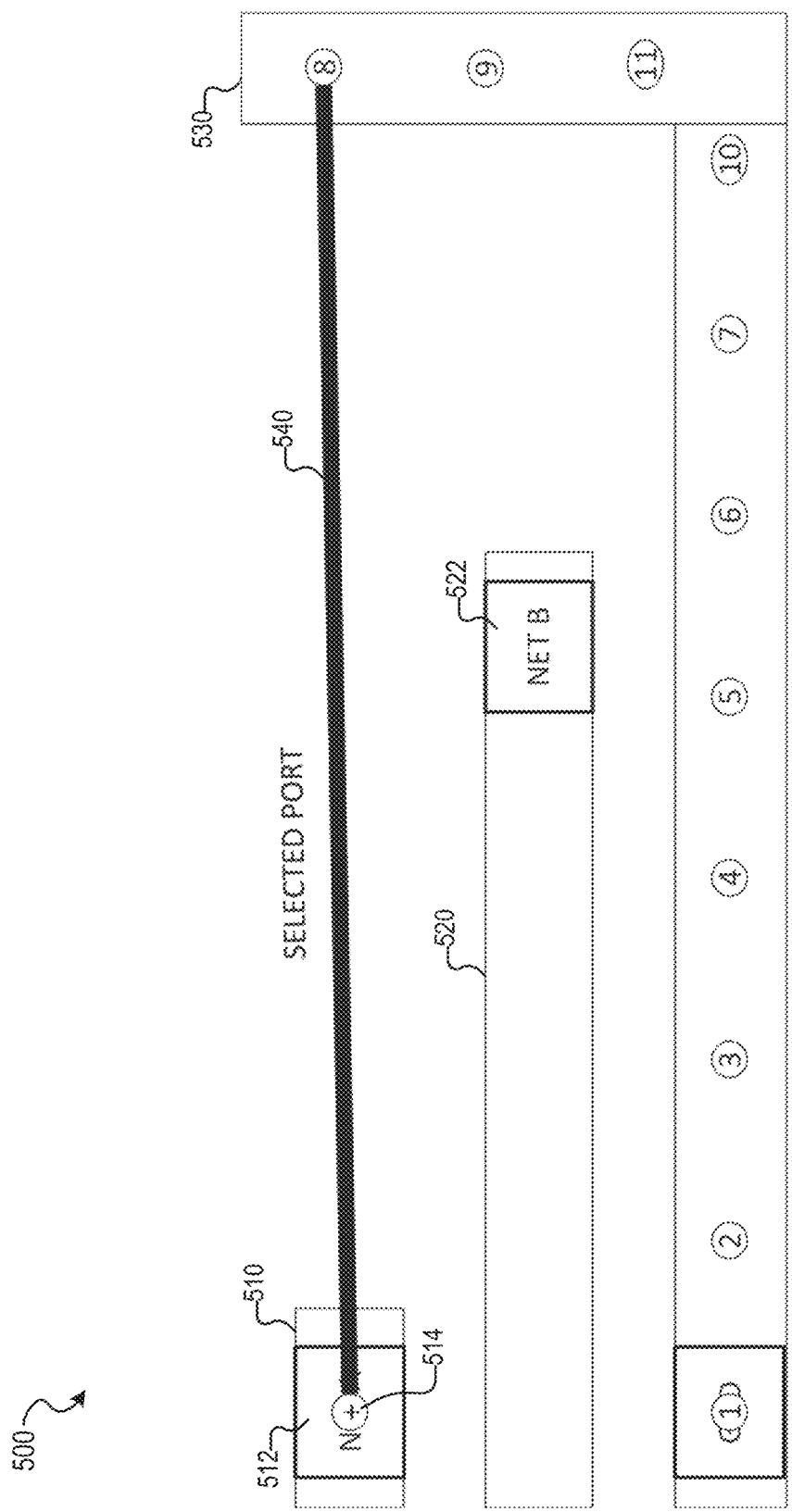
FIGS. 5 through 7 illustrate example layouts of example circuit designs that can be processed by some embodiments.
Figure 6:
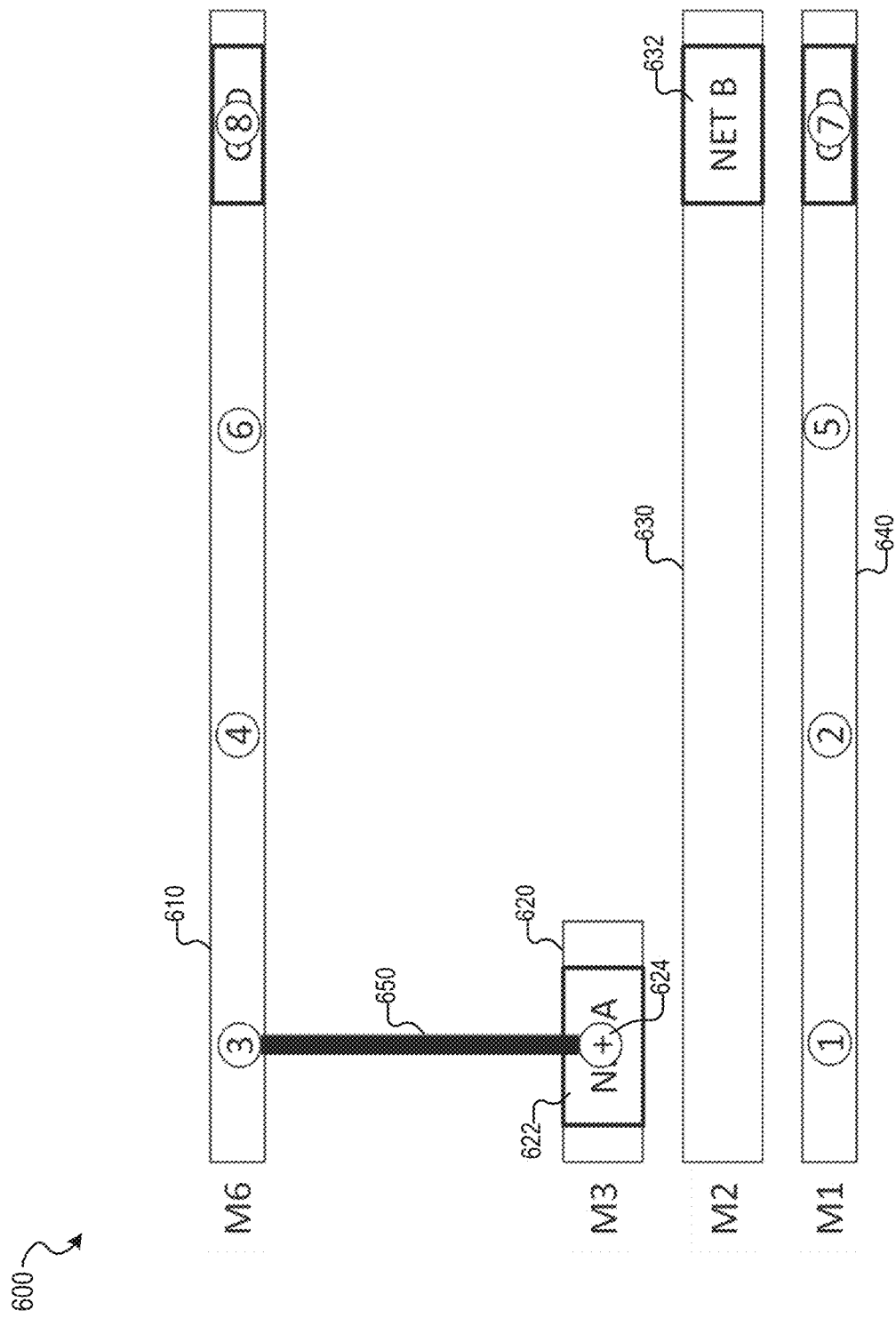
Figure 7:
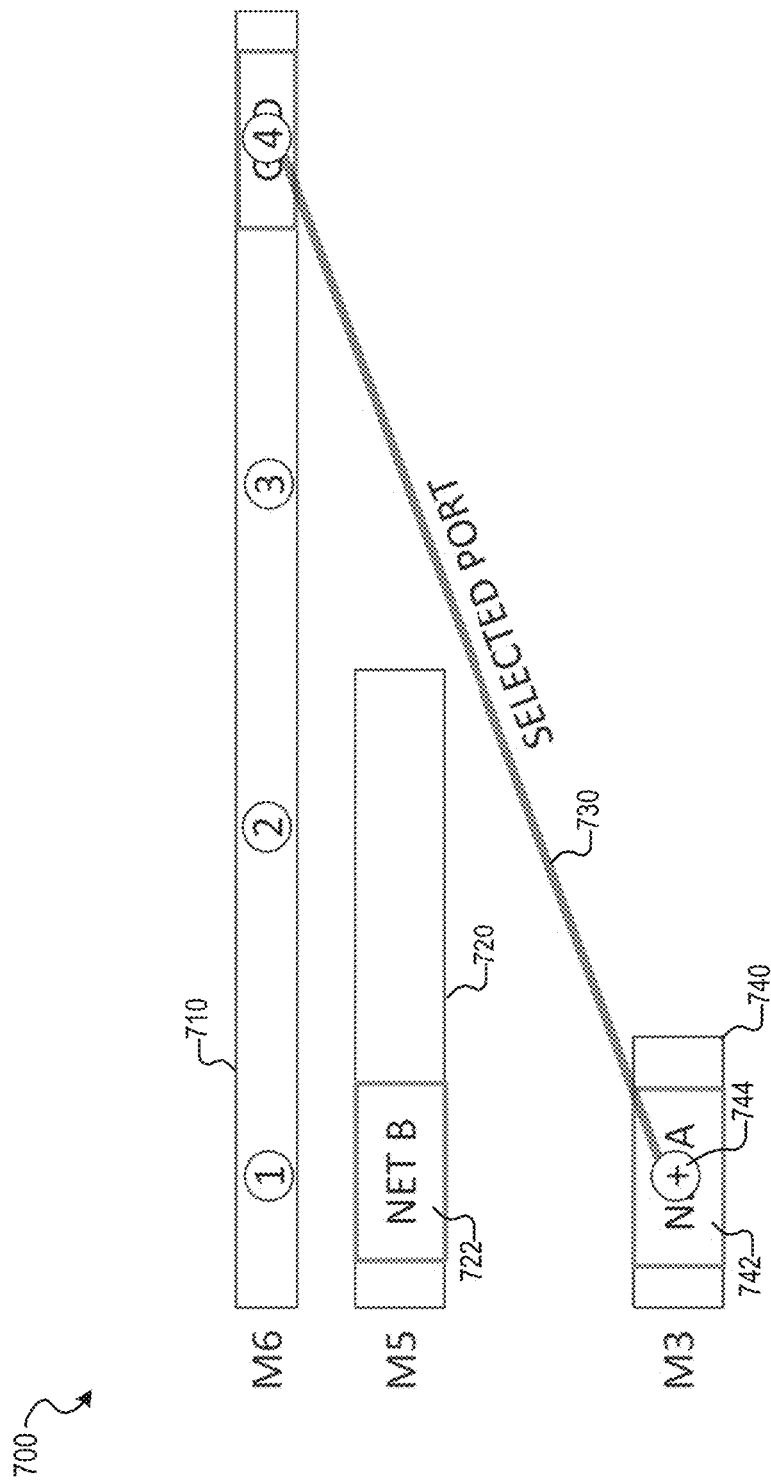

FIGS. 5 through 7 illustrate example layouts of example circuit designs that can be processed by some embodiments. In particular, FIG. 5 illustrates an example layout 500 comprising a signal network 510 (NET A) that has a pin 512, a signal network 520 (NET B) that has a pin 522, and a ground network 530. According to some embodiments, point 514 is disposed at a center of the pin 512 on the signal network 510, and a mesh of points 1 through 8 are uniformly distributed across geographic shapes that form the ground network 530, where points 1 through 8 represent candidate negative connections. Based on operation of some embodiments, for the point 514 representing a positive connection for the signal network 510, point 8 disposed on the ground network 530 is selected as the point nearest to point 514. Point 8 is determined to be a negative connection for a selected port 540, and the selected port 540 is generated between point 514 and point 8. As shown, the selected port 540 is presumed valid as it does not intersect any conductors. The selected port 540 can represent a same layer port.

FIG. 6 illustrates an example layout 600 comprising a ground network 610 disposed on metal layer M6, a signal network 620 (NET A) disposed on metal layer M3 and having a pin 622, a signal network 630 (NET B) disposed on metal layer M2 and having a pin 632, and a ground network 640 disposed on metal layer M1. According to some embodiments, point 624 is disposed at a center of the pin 622 on the signal network 620, and a mesh of points 3, 4, 6, 8 are uniformly distributed across a geographic shape that forms the ground network 610, where points 3, 4, 6, 8 represent candidate negative connections on the ground network 610. A mesh of points 1, 2, 5, 7 are uniformly distributed across a geographic shape that forms the ground network 640, where points 1, 2, 5, 7 represent candidate negative connections on the ground network 640. Based on operation of some embodiments, for the point 624 representing a positive connection for the signal network 620, point 3 disposed on the ground network 610 is selected as the point nearest to point 624. Point 3 is determined to be a negative connection for a selected port 650, and the selected port 650 is generated between point 624 and point 3. The selected port 650 can represent a vertical cross-layer port.

FIG. 7 illustrates an example layout 700 comprising a ground network 710 disposed on metal layer M6, a signal network 720 (NET B) disposed on metal layer M5 and having a pin 722, and a signal network 740 (NET A) disposed on metal layer M3 and having a pin 742. According to some embodiments, point 744 is disposed at a center of the pin 742 on the signal network 740, and a mesh of points 1 through 4 are uniformly distributed across a geographic shape that forms the ground network 710, where points 1 through 4 represent candidate negative connections on the ground network 710. Based on operation of some embodiments, for the point 744 representing a positive connection for the signal network 740, point 4 disposed on the ground network 710 is selected as the point nearest to point 744. Point 4 is determined to be a negative connection for a selected port 730, and the selected port 730 is generated between point 744 and point 4. The selected port 730 can represent a diagonal cross-layer port.

FIGS. 8 through 10 illustrate examples for distributing points within graphic shapes of networks, according to some embodiments. In particular, FIG. 8 illustrates an example of uniformly distributing a set of points in individual trapezoids. According to some embodiments, after finding all geographic shapes of a network (e.g., reference network) of a circuit design, the geographic shapes are converted to a polygon 810 at stage 802. At stage 804, the polygon 810 is sliced into trapezoids 820 and 822 (e.g., using a sweep line approach). Thereafter, at stage 806, within each of the trapezoids 820 and 822, a set of points (e.g., 830) is uniformly distributed within the trapezoid and distributed starting in the center of the trapezoid. An example of this is illustrated in FIG. 9.

FIG. 9 illustrates an example of generating an orthogonal point lattice in individual trapezoids. As shown, at stage 902, a centers 920,922 are determined (e.g., identified) for trapezoids 910, 912 respectively. A center of a trapezoid can be determined using a mass center for triangle or center of a bound box for a four-point trapezoid. At stage 904, an orthogonal point lattice is generated (e.g., built) around each of the centers 920, 922 and generated with a given spacing (A). As described herein, the orthogonal point lattice can represent candidate negative connections for a port. Depending on the embodiment, the given space can be provided by a user or derived from one or more design rules, such as minimum spacing (e.g., minSpacing) or minimum width (e.g., minWidth). For some embodiments, an orthogonal point lattice is generated for an individual trapezoid (e.g., 910 or 912) such that the lattice is bounded to a bounding box of the individual trapezoid. As part of stage 904, each trapezoid (e.g., 910 or 912) is checked to determine whether any point of their respective lattice is inside the actual trapezoid and discard such points. For example, point 930 represents a point of the orthogonal point lattice of the trapezoid 912 that is outside of the trapezoid 912 and would be discarded at stage 906. For some embodiments, the check for outside points for individual trapezoids is limited to those individual trapezoids that have non-Manhattan edges (thereby limiting the number of trapezoids that need to be checked for outside points).

FIG. 10 illustrates an example of adding points to an orthogonal point lattice based on a positive connection. The added points can represent special candidate negative connections, which can be determined based on a user preference. According to some embodiments, one or more additional points (e.g., as additional candidate negative connections) are added for each point representing a positive point connection on one or more signal networks of a circuit design. For example, as illustrated by FIG. 10, for a given point representing a positive connection, additional points can be added to an orthogonal point lattice of an individual trapezoid such that the additional points either have: the same horizontal (e.g., x-axis) coordinate as the given point and the same vertical (e.g., y-axis) coordinate as at least one existing point of the orthogonal point lattice; or the same horizontal (e.g., x-axis) coordinate as at least one existing point of the orthogonal point lattice and the same vertical (e.g., y-axis) coordinate as the given point. For example, at stage 1002, a point 1030 is added for a positive connection on a signal network of a circuit design. As illustrated, trapezoids 1010, 1012 are generated, with each having its own orthogonal point lattice representing candidate negative connections. An example of this is illustrated by FIG. 10. At stage 1004, a horizontal coordinate 1020 is identified for point 1030, and a vertical coordinate 1022 is identified for point 1030. Accordingly, at stage 1006, a row of additional points 1040 are added to the orthogonal point lattice of the trapezoid 1010 such that additional points 1040 all share the vertical coordinate 1022 of point 1030 while having a horizontal coordinate that aligns with one of the existing points of the orthogonal point lattice. Additionally, at stage 1006, an additional point 1042 is added to the orthogonal point lattice of the trapezoid 1012 such that the additional point 1042 has the horizontal coordinate 1020 of point 1030 while sharing a vertical coordinate with a row of existing points of the orthogonal point lattice.

Figure 11:
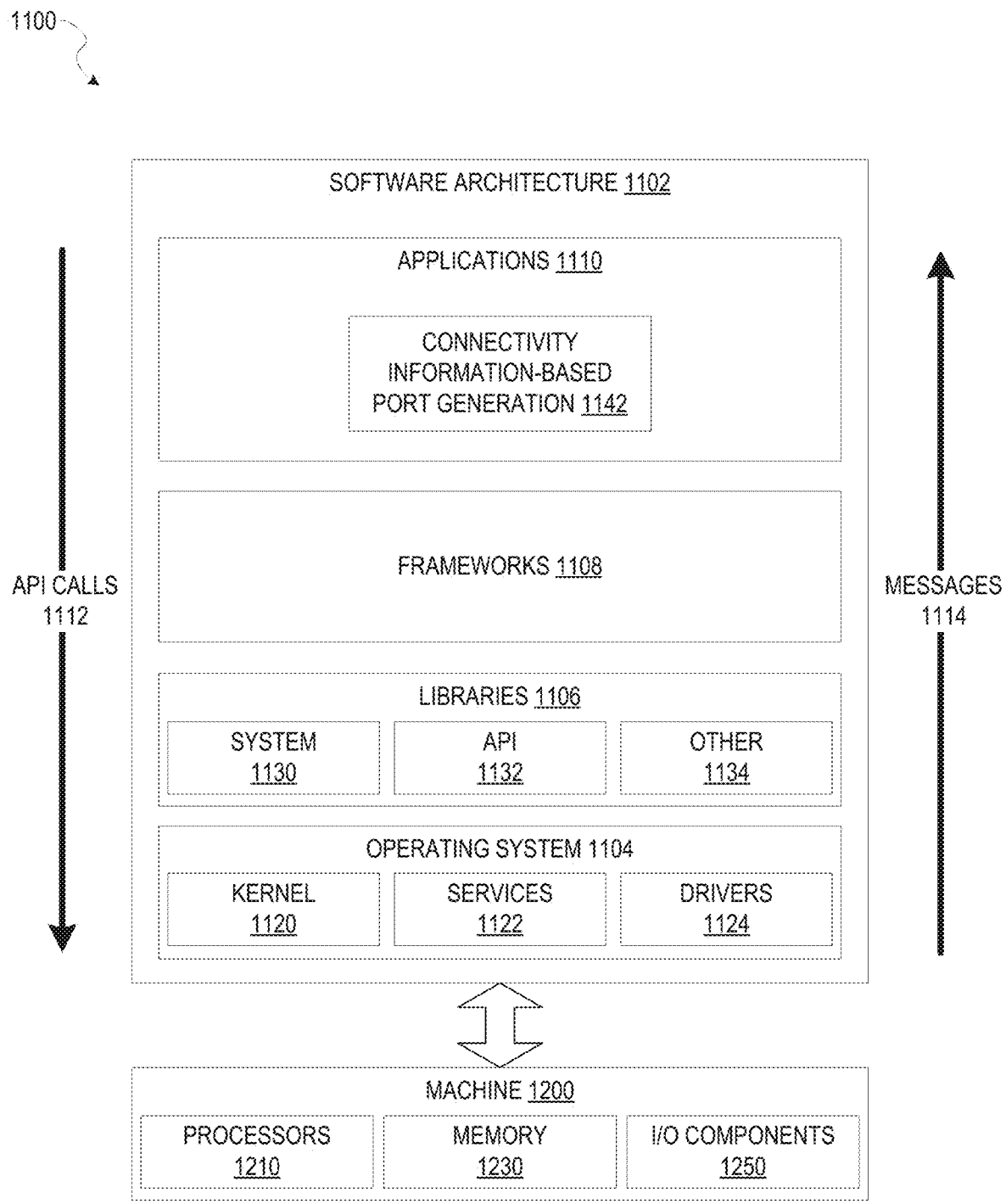
FIG. 11 is a block diagram illustrating an example of a software architecture that may be operating on an electronic design automation (EDA) computing device and may be used with methods for port generation for a circuit design based on layout connectivity information, according to some embodiments.

FIG. 11 is a block diagram 1100 illustrating an example of a software architecture 1102 that may be operating on an EDA computer and may be used with methods for port generation for a circuit design based on layout connectivity information, according to some embodiments. The software architecture 1102 can be used as an EDA computing device to implement any of the methods described above. Aspects of the software architecture 1102 may, in various embodiments, be used to store circuit designs, and to facilitate generation of a circuit design in an EDA environment, from which physical devices may be generated.

FIG. 11 is merely a non-limiting example of a software architecture 1102, and it will be appreciated that many other architectures can be implemented to facilitate the functionality described herein. In various embodiments, the software architecture 1102 is implemented by hardware such as a machine 1200 of FIG. 12 that includes processors 1210, memory 1230, and I/O components 1250. In this example, the software architecture 1102 can be conceptualized as a stack of layers where each layer may provide a particular functionality. For example, the software architecture 1102 includes layers such as an operating system 1104, libraries 1106, software frameworks 1108, and applications 1110. Operationally, the applications 1110 invoke application programming interface (API) calls 1112 through the software stack and receive messages 1114 in response to the API calls 1112, consistent with some embodiments. In various embodiments, any client device, any server computer of a server system, or any other device described herein may operate using elements of the software architecture 1102. An EDA computing device described herein may additionally be implemented using aspects of the software architecture 1102, with the software architecture 1102 adapted for operating to perform port generation for a circuit design in a manner described herein.

In some embodiments, an EDA application of the applications 1110 performs port generation for a circuit design based on layout connectivity information according to embodiments described herein using various modules within the software architecture 1102. For example, in some embodiments, an EDA computing device similar to the machine 1200 includes the memory 1230 and the one or more processors 1210. The processors 1210 also implement a connectivity information-based port generation module 1142 for port generation for a circuit design based on layout connectivity information, in accordance with various embodiments described herein.

In various other embodiments, rather than being implemented as modules of the one or more applications 1110, the connectivity information-based port generation module 1142 may be implemented using elements of the libraries 1106, the operating system 1104, or the software frameworks 1108.

In various implementations, the operating system 1104 manages hardware resources and provides common services. The operating system 1104 includes, for example, a kernel 1120, services 1122, and drivers 1124. The kernel 1120 acts as an abstraction layer between the hardware and the other software layers, consistent with some embodiments. For example, the kernel 1120 provides memory management, processor management (e.g., scheduling), component management, networking, and security settings, among other functionality. The services 1122 can provide other common services for the other software layers. The drivers 1124 are responsible for controlling or interfacing with the underlying hardware, according to some embodiments. For instance, the drivers 1124 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1106 provide a low-level common infrastructure utilized by the applications 1110. The libraries 1106 can include system libraries 1130 such as libraries of blocks for use in an EDA environment or other libraries that can provide functions such as memory allocation functions, string manipulation functions, mathematic functions, and the like. In addition, the libraries 1106 can include API libraries 1132 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 1106 may also include other libraries 1134.

The software frameworks 1108 provide a high-level common infrastructure that can be utilized by the applications 1110, according to some embodiments. For example, the software frameworks 1108 provide various graphic user interface (GUI) functions, high-level resource management, high-level location services, and so forth. The software frameworks 1108 can provide a broad spectrum of other APIs that can be utilized by the applications 1110, some of which may be specific to a particular operating system 1104 or platform. In various embodiments, the systems, methods, devices, and instructions described herein may use various files, macros, libraries, and other elements of an EDA design environment to implement port generation for a circuit design based on layout connectivity information as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1102, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1200 including processors 1210), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 1200, but deployed across a number of machines 1200. In some embodiments, the processors 1210 or processor-implemented modules are located in a single geographic location (e.g., within a home environment, an office environment, or a server farm). In some other embodiments, the processors or processor-implemented modules are distributed across a number of geographic locations.

Figure 12:
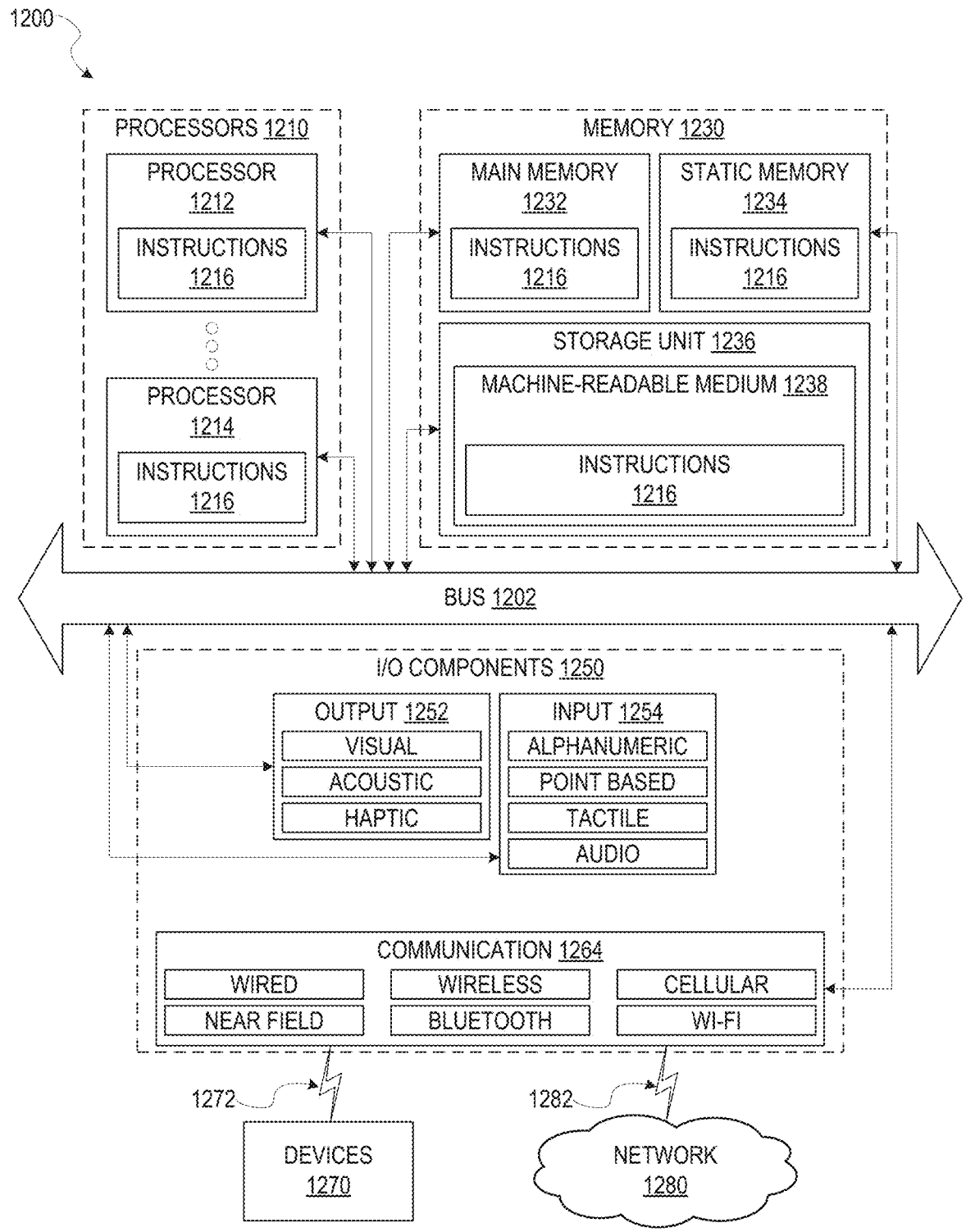
FIG. 12 is a diagram representing a machine in the form of a computer system within which a set of instructions are executed, causing the machine to perform any one or more of the methods discussed herein, according to some embodiments.

FIG. 12 is a diagrammatic representation of the machine 1200 in the form of a computer system within which a set of instructions may be executed for causing the machine 1200 to perform any one or more of the methodologies discussed herein, according to some embodiments. FIG. 12 shows components of the machine 1200, which is, according to some embodiments, able to read instructions from a machine-readable medium (e.g., a machine-readable storage medium) and perform any one or more of the methodologies discussed herein. Specifically, FIG. 12 shows a diagrammatic representation of the machine 1200 in the example form of a computer system, within which instructions 1216 (e.g., software, a program, an application, an applet, an app, or other executable code) for causing the machine 1200 to perform any one or more of the methodologies discussed herein can be executed. In alternative embodiments, the machine 1200 operates as a standalone device or can be coupled (e.g., networked) to other machines. In a networked deployment, the machine 1200 may operate in the capacity of a server machine or a client machine in a server-client network environment, or as a peer machine in a peer-to-peer (or distributed) network environment. The machine 1200 can comprise, but not be limited to, a server computer, a client computer, a personal computer (PC), a tablet computer, a laptop computer, a netbook, or any machine capable of executing the instructions 1216, sequentially or otherwise, that specify actions to be taken by the machine 1200. Further, while only a single machine 1200 is illustrated, the term "machine" shall also be taken to include a collection of machines 1200 that individually or jointly execute the instructions 1216 to perform any one or more of the methodologies discussed herein.

In various embodiments, the machine 1200 comprises processors 1210, memory 1230, and I/O components 1250, which can be configured to communicate with each other via a bus 1202. In some embodiments, the processors 1210 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1212 and a processor 1214 that may execute the instructions 1216. The term "processor" is intended to include multi-core processors 1210 that may comprise two or more independent processors 1212, 1214 (also referred to as "cores") that can execute the instructions 1216 contemporaneously. Although FIG. 12 shows multiple processors 1210, the machine 1200 may include a single processor 1212 with a single core, a single processor 1212 with multiple cores (e.g., a multi-core processor 1212), multiple processors 1210 with a single core, multiple processors 1210 with multiple cores, or any combination thereof.

The memory 1230 comprises a main memory 1232, a static memory 1234, and a storage unit 1236 accessible to the processors 1210 via the bus 1202, according to some embodiments. The storage unit 1236 can include a machine-readable medium 1238 on which are stored the instructions 1216 embodying any one or more of the methodologies or functions described herein. The instructions 1216 can also reside, completely or at least partially, within the main memory 1232, within the static memory 1234, within at least one of the processors 1210 (e.g., within the processor's cache memory), or any suitable combination thereof, during execution thereof by the machine 1200. Accordingly, in various embodiments, the main memory 1232, the static memory 1234, and the processors 1210 are considered machine-readable media 1238.

As used herein, the term "memory" refers to a machine-readable medium 1238 able to store data temporarily or permanently and may be taken to include, but not be limited to, random-access memory (RAM), read-only memory (ROM), buffer memory, flash memory, and cache memory. While the machine-readable medium 1238 is shown, in some embodiments, to be a single medium, the term "machine-readable medium" should be taken to include a single medium or multiple media (e.g., a centralized or distributed database, or associated caches and servers) able to store the instructions 1216. The term "machine-readable medium" shall also be taken to include any medium, or combination of multiple media, that is capable of storing instructions (e.g., the instructions 1216) for execution by a machine (e.g., the machine 1200), such that the instructions, when executed by one or more processors of the machine (e.g., the processors 1210), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1250 include a wide variety of components to receive input, provide output, produce output, transmit information, exchange information, capture measurements, and so on. In general, it will be appreciated that the I/O components 1250 can include many other components that are not shown in FIG. 12. The I/O components 1250 are grouped according to functionality merely for simplifying the following discussion, and the grouping is in no way limiting. In various embodiments, the I/O components 1250 include output components 1252 and input components 1254. The output components 1252 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1254 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1250 may include communication components 1264 operable to couple the machine 1200 to a network 1280 or devices 1270 via a coupling 1282 and a coupling 1272, respectively. For example, the communication components 1264 include a network interface component or another suitable device to interface with the network 1280. In further examples, the communication components 1264 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1270 may be another machine or any of a wide variety of peripheral devices (e.g., a peripheral device coupled via a USB).

In various embodiments, one or more portions of the network 1280 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1280 or a portion of the network 1280 may include a wireless or cellular network, and the coupling 1282 may be a Code Division Multiple Access (CDMA) connection, a Global System for Mobile communications (GSM) connection, or another type of cellular or wireless coupling.

Furthermore, the machine-readable medium 1238 is non-transitory (in other words, not having any transitory signals) in that it does not embody a propagating signal. However, labeling the machine-readable medium 1238 "non-transitory" should not be construed to mean that the machine-readable medium 1238 is incapable of movement; the machine-readable medium 1238 should be considered as being transportable from one physical location to another. Additionally, since the machine-readable medium 1238 is tangible, the machine-readable medium 1238 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:

accessing circuit design data that describes connectivity information for a set of networks of a circuit design, the set of networks including a signal network and a reference network; and generating an individual port that connects the signal network to the reference network, the generating of the individual port comprising:

determining, based on the connectivity information, a positive connection disposed on the signal network;

determining, based on the connectivity information, a set of candidate negative connections disposed on the reference network;

selecting, from the set of candidate negative connections, an individual negative connection such that a candidate port formed between the individual negative connection and the positive connection is valid and provides a shortest length; and generating, as the individual port, the candidate port between the individual negative connection and the positive connection with a select width based on one or more port validity criteria.

2. The non-transitory computer-readable medium of claim 1, wherein the individual port is generated for use by a finite element method (FEM) electromagnetic solver.

3. The non-transitory computer-readable medium of claim 1, wherein the determining of the positive connection based on the connectivity information comprises:

selecting a center of a positive connection pin of the signal network as the positive connection of the individual port.

4. The non-transitory computer-readable medium of claim 1, wherein the generating of the candidate port between the individual negative connection and the positive connection with the select width based on the one or more port validity criteria comprises:

generating the candidate port between the individual negative connection and the positive connection with the select width based on the one or more port validity criteria and based on at least one of a minimal port width or a maximum port width.

5. The non-transitory computer-readable medium of claim 4, wherein the generating of the candidate port between the individual negative connection and the positive connection with the select width based on the at least one of a minimal port width or the maximum port width comprises:

determining the select width by performing a bisection method on the minimal port width and the maximum port width.

6. The non-transitory computer-readable medium of claim 1, wherein the generating of the individual port that connects the signal network to the reference network comprises:

determining, based on the connectivity information, a plurality of points that are disposed across geometric shapes forming the set of networks of the circuit design, wherein the determining of the positive connection disposed on the signal network comprises selecting an individual point, from the plurality of points, on the signal network as the positive connection, and wherein the determining of the set of candidate negative connections disposed on the reference network comprises selecting a set of points, from the plurality of points, on the reference network as the set of candidate negative connections.

7. The non-transitory computer-readable medium of claim 6, wherein the generating of the individual port that connects the signal network to the reference network comprises:

adding, to the plurality of points, one or more points that correspond to one or more pins of the circuit design.

8. The non-transitory computer-readable medium of claim 1, wherein the selecting of the individual negative connection from the set of candidate negative connections comprises:

selecting the individual negative connection from the set of candidate negative connections based on a resulting length of the candidate port.

9. The non-transitory computer-readable medium of claim 1, wherein the generating of the candidate port between the individual negative connection and the positive connection comprises:

determining, based on the connectivity information, a plurality of points that are uniformly disposed across geometric shapes forming one or more reference networks in the set of networks;

adding, to the plurality of points, one or more points associated with one or more pins of the circuit design;

adding the plurality of points to a data structure configured for performing nearest-neighbor search; and performing a nearest neighbor search, in the data structure, for a second point nearest to the positive connection, the second point representing a select negative connection that would form a valid port with the positive connection.

10. The non-transitory computer-readable medium of claim 9, wherein the valid port has a select width based on one or more port validity criteria and based on at least one of a minimal port width or a maximum port width.

11. The non-transitory computer-readable medium of claim 9, wherein the determining, based on the connectivity information, of the plurality of points that are uniformly disposed across geometric shapes forming the one or more reference networks comprises:

determining one or more geometric shapes of the reference network;

converting the one or more shapes into one or more polygons; and for each individual polygon of the one or more polygons;

slicing the individual polygon into a plurality of trapezoids; and for each individual trapezoid in the plurality of trapezoids, uniformly distributing a set of points in the individual trapezoid.

12. The non-transitory computer-readable medium of claim 11, wherein the uniformly distributing of the set of points in the individual trapezoid comprises:

identifying a center of the individual trapezoid; and generating an orthogonal point lattice around the center with a given spacing.

13. The non-transitory computer-readable medium of claim 12, wherein the uniformly distributing of the set of points in the individual trapezoid comprises:

in response to the individual trapezoid having at least one non-Manhattan edge, removing any points from the orthogonal point lattice that are not within the individual trapezoid.

14. The non-transitory computer-readable medium of claim 13, wherein the adding, to the plurality of points, of the one or more points associated with the one or more pins of the circuit design comprises:

for an individual positive connection, adding to the plurality of points at least one additional point disposed within the individual trapezoid, the at least one additional point either having;

a first horizontal coordinate corresponding to a location of the individual positive connection and a first vertical coordinate corresponding to at least one point in the orthogonal point lattice; or a second horizontal coordinate corresponding to the at least one point in the orthogonal point lattice and a second vertical coordinate corresponding to the location of the individual positive connection.

15. The non-transitory computer-readable medium of claim 1, wherein the selecting of the individual negative connection from the set of candidate negative connections comprises:

causing presentation of the set of candidate negative connections on a client device; and receiving, by the client device, a user selection of the individual negative connection.

16. A device comprising:

a memory storing instructions; and a hardware processor communicatively coupled to the memory and configured by the instructions to perform operations comprising: generating, based on connectivity information for a set of networks of a circuit design, an individual port that connects a signal network of the set of networks to a reference network of the set of networks, the generating of the individual port comprising:

determining, based on the connectivity information, a positive connection disposed on the signal network;

determining, based on the connectivity information, a set of candidate negative connections disposed on the reference network;

selecting, from the set of candidate negative connections, an individual negative connection such that a candidate port formed between the individual negative connection and the positive connection is valid and provides a shortest length; and generating, as the individual port, the candidate port between the individual negative connection and the positive connection with a select width based on one or more port validity criteria.

17. The device of claim 16, wherein the determining of the positive connection based on the connectivity information comprises:

selecting a center of a positive connection pin of the signal network as the positive connection of the individual port.

18. The device of claim 16, wherein the generating of the candidate port between the individual negative connection and the positive connection with the select width based on the one or more port validity criteria comprises:

generating the candidate port between the individual negative connection and the positive connection with the select width based on the one or more port validity criteria and based on at least one of a minimal port width or a maximum port width.

19. The device of claim 16, wherein the generating the individual port that connects the signal network to the reference network comprises:

determining, based on the connectivity information, a plurality of points that are disposed across geometric shapes forming the set of networks of the circuit design, wherein the determining of the positive connection disposed on the signal network comprises selecting an individual point, from the plurality of points, on the signal network as the positive connection, and wherein the determining of the set of candidate negative connections disposed on the reference network comprises selecting a set of points, from the plurality of points, on the reference network as the set of candidate negative connections.

20. A method comprising:

accessing, by a hardware processor, circuit design data that describes connectivity information for a signal network of a circuit design and a reference network of the circuit design; and generating, by the hardware processor, an individual port that connects the signal network to the reference network, the generating of the individual port comprising:
- determining, based on the connectivity information, a positive connection disposed on the signal network;
- determining, based on the connectivity information, a set of candidate negative connections disposed on the reference network;
- selecting, from the set of candidate negative connections, an individual negative connection such that a candidate port formed between the individual negative connection and the positive connection is valid and provides a shortest length; and
- generating, as the individual port, the candidate port between the individual negative connection and the positive connection with a select width based on one or more port validity criteria.

* * * * *